United States Patent
Kai et al.

(10) Patent No.: US 7,714,507 B2
(45) Date of Patent: May 11, 2010

(54) ORGANIC ELECTROLUMINESCENCE DISPLAY DEVICE HAVING RED, GREEN, BLUE AND WHITE PIXELS

(75) Inventors: Kazuhiko Kai, Mobara (JP); Kiyoshige Kinugawa, Mutsuzawa (JP); Masato Ito, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 497 days.

(21) Appl. No.: 11/679,287

(22) Filed: Feb. 27, 2007

(65) Prior Publication Data

US 2007/0200495 A1    Aug. 30, 2007

(30) Foreign Application Priority Data

Feb. 28, 2006    (JP)    ............................... 2006-051541

(51) Int. Cl.
*H05B 33/00*    (2006.01)
(52) U.S. Cl. ........................ 313/506; 313/504; 313/505
(58) Field of Classification Search .......... 313/498–512
See application file for complete search history.

(56) References Cited

U.S. PATENT DOCUMENTS

2006/0197458 A1*    9/2006    Winters et al. ........... 315/169.1
2006/0238119 A1*   10/2006    Spindler ..................... 313/506

FOREIGN PATENT DOCUMENTS

JP    2004-311440    11/2004

* cited by examiner

*Primary Examiner*—Joseph L Williams
(74) *Attorney, Agent, or Firm*—Antonelli, Terry, Stout & Kraus, LLP.

(57) ABSTRACT

The recent invention provide an organic electroluminescence display device with color purity adjustment, particularly white purity increased, without increasing formation processes. For each of unit pixels formed on an insulating film INS formed on a principal surface of a glass substrate, a bank BNK is provided on a bottom electrode BEL being a pixel electrode. The bank BNK has the shape of a bank that surrounds a pixel concerned, for each of pixels, and an organic electroluminescence light emitting layer is charged within a region surrounded by the banks BNKs. Between the banks BNKs, a green light emitting layer (G light emitting layer), a blue light emitting layer (B light emitting layer), and a red light emitting layer (R light emitting layer) are provided. At the same time as the formation of these color light emitting layers, light emitting layers of three colors, the green light emitting layer (G light emitting layer), the blue light emitting layer (B light emitting layer), and the red light emitting layer (R light emitting layer) are stacked on a region of a white pixel to form a white light emitting layer (G+B+R). An upper electrode UEL is formed over the green light emitting layer (G light emitting layer), the blue light emitting layer (B light emitting layer), the red light emitting layer (R light emitting layer), and the white light emitting layer (G+B+R light emitting layer).

7 Claims, 6 Drawing Sheets

FIG.1
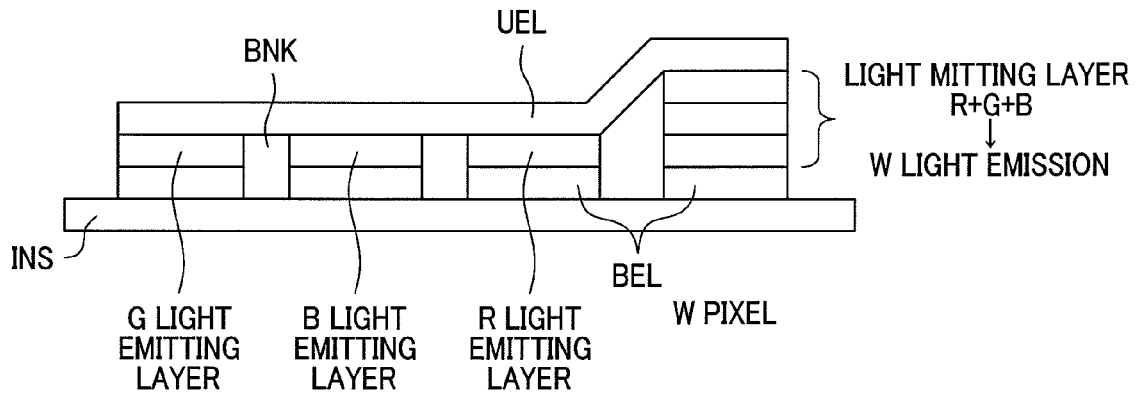
FIG.2A → FIG.2B
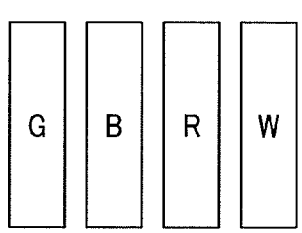 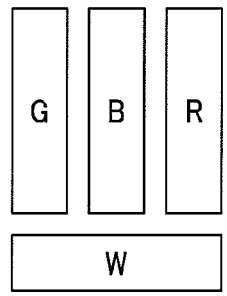
FIG.2C   FIG.2D
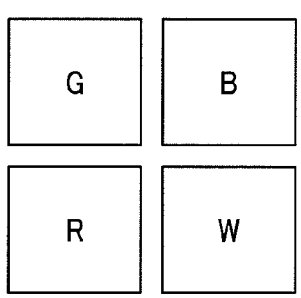 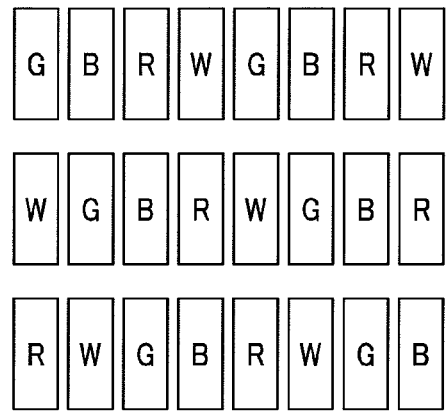

MASK FOR G

MASK FOR R

MASK FOR B

SECTIONAL VIEW
ALONG LINE A-A

MASK FOR R

MASK FOR G

MASK FOR B

SECTIONAL VIEW ALONG LINE C-C

ORGANIC ELECTROLUMINESCENCE DISPLAY DEVICE HAVING RED, GREEN, BLUE AND WHITE PIXELS

CLAIM OF PRIORITY

The present application claims priority from Japanese Application JP 2006-051541 filed on Feb. 28, 2006, the content of which is hereby incorporated by reference into this application.

BACKGROUND OF THE INVENTION

The present invention relates to organic electroluminescence display devices, and more particularly to an increase in brightness in an organic electroluminescence display device with organic electroluminescence elements of plural colors stacked on an insulating substrate that makes full color display.

As display devices of flat panel type, liquid crystal displays (LCD), plasma display panels (PDP), field emission displays (FED), and organic electroluminescence displays (OLED) are commercially practical or in the stage of a study for practical use. Particularly, the organic electroluminescence display devices are greatly promising as a representative of display devices of spontaneous emission type that are thin and light in weight. The organic electroluminescence display devices are classified as a so-called bottom emission type and a top emission type. The present invention is described with respect to organic electroluminescence display devices of an active matrix type. However, a light emitting layer structure holds true for organic electroluminescence display devices of a simple matrix as well.

FIGS. 7A and 7B are drawings for explaining the structure of an organic electroluminescence display device of bottom emission type. FIG. 7A is a sectional view for explaining an overall structure, and FIG. 7B is a sectional view for explaining the structure of a unit pixel. In the organic electroluminescence display device of bottom emission type, a thin film transistor TFT is provided on the principal surface of an insulating substrate SUB being preferably a glass substrate, a first electrode or one electrode (hereinafter referred to as a bottom electrode or a transparent electrode (ITO, etc.) as a pixel electrode) BEL is formed via a contact hole formed on an insulating film INS. The bottom electrode BEL is formed independently for each of unit pixels.

A bank BNK formed from an insulating material is provided over the region in which the thin film transistor TFT is formed, separates one adjacent unit pixel from another, and serves to accommodate an organic light emitting layer ILL that emits light on application of an electric field. A reflective metallic electrode as a second electrode (common electrode) or another electrode, that is, an upper electrode UEL is stacked over the organic light emitting layer ILL. The insulating substrate SUB having organic electroluminescence elements thus constructed on its principal surface is isolated by a sealing can CAV from the external atmosphere, and is sealed with a sealant such as an adhesive. A desiccant DSC is stored in the inside sealed by the sealing can CAV.

By applying an electric field to between the bottom electrode BEL as an anode and the upper electrode UEL as a cathode, carriers (electrons and positive holes) are injected to the organic electroluminescence elements composed of organic multilayer films, and the organic multilayer films emit light. Light emitted from the organic electroluminescence device is emitted as display light via the insulating substrate SUB. A full-color image is displayed by arraying a plural number of color pixels in a matrix form, which are the red (R), green (G), and blue (B) unit pixels of the organic electroluminescence elements.

FIGS. 8A and 8B are drawings for explaining the structure of an organic electroluminescence display device of top emission type. FIG. 8A is a sectional view for explaining an overall structure, and FIG. 8B is a sectional view for explaining the structure of a unit pixel. In the organic electroluminescence display device of top emission type, the bottom electrode BEL corresponding to one electrode of the above-described organic electroluminescence display device of bottom emission type is constructed with a reflective metallic electrode, and the upper electrode UEL being another electrode is constructed with a transparent electrode such as ITO, organic multilayer films emit light when an electric field is applied to between the both, and the emitted light L is emitted from the upper electrode UEL. In the top emission type, a transparent plate being preferably a glass plate is used as the sealing can in the bottom emission type, and desiccant DSC is a transparent material or disposed in a portion that does not cut off display light. Other parts of the structure are almost the same as those in FIGS. 7A and 7B.

Technology is known for displaying full-color images in combination of color filters of red (R), green (G), and blue (B) with a white organic electroluminescence element, instead of organic electroluminescence elements of red (R), green (G), and blue (B).

In Japanese Patent Laid Open No. 2004-311440, an R-G-B-W method is disclosed by which an organic electroluminescence element of white (W) is added to organic electroluminescence elements of red (R), green (G), and blue (B) to increase display brightness.

In the R-G-B-W method disclosed in the Japanese Patent Laid Open No. 2004-311440, separate organic electroluminescence films to emit light of red (R), green (G), blue (B), white (W) are formed with the same layer thickness, and four organic electroluminescence film formation processes such as evaporation are required. Since a conventional organic electroluminescence film to emit white (W) light is generally formed from a mixture of luminescent materials of two colors, an emission spectrum tends to be gentle and color balance adjustment (color purity adjustment) is difficult. In the case of an organic electroluminescence display device with color filters of red (R), green (G), and blue (B) combined with a white organic electroluminescence element, since part of light emitted from the organic electroluminescence elements is absorbed by the color filters, light extracting efficiency decreases.

SUMMARY OF THE INVENTION

An object of the present invention is to provide an organic electroluminescence display device with color purity adjustment, particularly white purity increased, without increasing formation processes.

To achieve the above-described object, an organic electroluminescence display device of the present invention includes plural first electrodes each formed for each of unit pixels on a principal surface of an insulating substrate, plural organic electroluminescence layers that are stacked on each of the first electrodes and emit color light different from each other, and a second electrode formed over the plural organic electroluminescence layers.

The plural organic electroluminescence layers, for each of unit pixels, are surrounded by banks that partition the region of a pixel concerned. The plural organic electroluminescence layers form a full color pixel by unit pixels respectively having color organic electroluminescence layers that emit three primary colors of light, and a unit pixel that emits white light. An organic electroluminescence layer of the unit pixel that emits white light is a multilayered film of the color organic electroluminescence layers that emit the three primary colors.

The thickness of the organic electroluminescence layer of the unit pixel that emits white light is larger than that of the color organic electroluminescence layers.

The distance difference between the top of the banks and the top of the organic electroluminescence layer of the unit pixel that emits white light is smaller than the distance difference between the top of the banks and the top of the color organic electroluminescence layers.

One layer of the multilayered film is made to continue to the color organic electroluminescence layers of pixels adjacent to the unit pixel that emits white light, over the banks.

Plural pixels of different colors that emit the three primary colors are disposed in a scanning direction, and pixels adjacent to the unit pixel that emits white light are the color pixels that are adjacent to one side or both sides in the scanning direction with respect to the unit pixel that emits white light.

The color organic electroluminescence layers that emit the three primary colors are stacked on the banks that surround pixels adjacent to the unit pixel that emits white light.

Organic electroluminescence layers of two colors of the color organic electroluminescence layers that emit three primary colors are stacked on the banks that surround pixels not adjacent to the unit pixel that emits white light.

Since a pixel structure of the present invention is made by forming an organic electroluminescence layer of a white pixel at the same time as the formation of color organic electroluminescence layers that emit three primary colors of light, there is no need to increase pixel formation processes. Since the organic electroluminescence display device of the present invention serves as a light source having emission peaks of the three primary colors, color purity can be easily adjusted, and high-brightness full color images with increased white purity can be obtained.

BRIEF DESCRIPTION OF THE DRAWINGS

FIG. 1 is a sectional view of one pixel of full color for explaining one embodiment of an organic electroluminescence display device of the R-G-B-W method of the present invention;

FIGS. 2A, 2B, 2C, and 2D are drawings for explaining a variation of pixel arrangement in an image display device of high-brightness full color;

DETAILED DESCRIPTION OF THE PREFERRED EMBODIMENTS

Figure 3A:
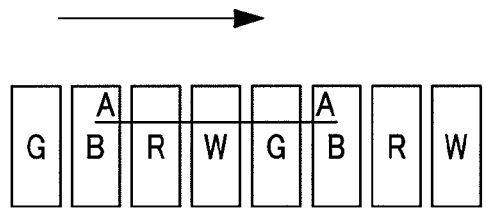
FIGS. 3A, 3B, 3C, 3D, and 3E are drawings for explaining an example of evaporation masks used for the formation of organic electroluminescence light emitting layers of an organic electroluminescence display device of the R-G-B-W method of the present invention.

Hereinafter, a preferred embodiment of the present invention will be described in detail with reference to the accompanying drawings. Although, in the embodiment below, an organic electroluminescence display device of bottom emission type is used as an example, an organic electroluminescence display device of top emission type is also the same as the former in the structure of an organic electroluminescence light emitting layer.

First Embodiment

FIG. 1 is a sectional view of a full color pixel for explaining one embodiment of an organic electroluminescence display device of the R-G-B-W method of the present invention. In this drawing, a thin film transistor TFT and the like are omitted. In FIG. 1, on an insulating film INS formed on a principal surface of a glass substrate not shown, a bottom electrode BEL being a pixel electrode is formed for each of unit pixels.

A bank BNK is provided over each bottom electrode BEL. The bank BNK has the shape of a bank that surrounds a pixel concerned, for each of pixels, and an organic electroluminescence light emitting layer is charged within a region surrounded by the banks BNKs. That is, in FIG. 1, between the banks BNKs, a green light emitting layer (G light emitting layer), a blue light emitting layer (B light emitting layer), and a red light emitting layer (R light emitting layer) are provided. At the same time as the formation of these color light emitting layers, light emitting layers of three colors, the green light emitting layer (G light emitting layer), the blue light emitting layer (B light emitting layer), and the red light emitting layer (R light emitting layer) are stacked on a region of a white pixel to form a white light emitting layer (G+B+R).

An upper electrode UEL is formed over the green light emitting layer (G light emitting layer), the blue light emitting layer (B light emitting layer), the red light emitting layer (R light emitting layer), and the white light emitting layer (G+B+R light emitting layer).

For a pixel thus constructed, by applying an electric field between the bottom electrode BEL and the upper electrode UEL, G color light, B color light, R color light, and W light being white light are emitted to a lower side of FIG. 1. Such pixels are two-dimensionally arranged (matrix array) to construct an image display device of high-brightness full color.

FIGS. 2A, 2B, 2C, and 2D are drawings for explaining a variation of pixel arrangement in the image display device of high-brightness full color. The arrow in the drawing indicates a horizontal scanning direction (the extending direction of gate lines). In the drawing, each pixel has a rectangular shape that is longitudinally long. FIG. 2A shows that a G color pixel, a B color pixel, an R color pixel, and a W light pixel are disposed in a horizontal scanning direction. FIG. 2B shows that a G color pixel, a B color pixel, and an R color pixel are disposed in the horizontal scanning direction, and a W light pixel is disposed at an angle of 90 degrees in a direction square to a horizontal scanning direction with respect to these color pixels. FIG. 2C shows that a G color pixel, a B color pixel, an R color pixel, and a W light pixel are disposed in a lattice pattern. FIG. 2D shows that W light pixels are adjacent to each other in a slanting direction on a matrix of the pixel arrangement shown in FIG. 2A.

Figure 3B:
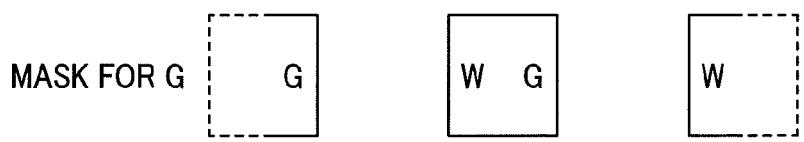
Figure 3C:
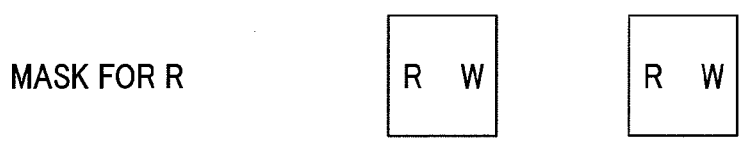
Figure 3D:
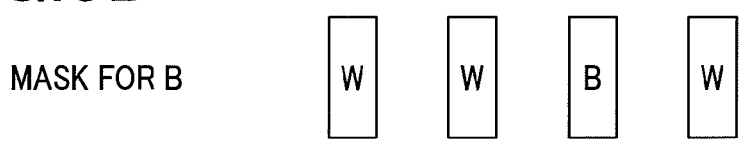
Figure 3E:
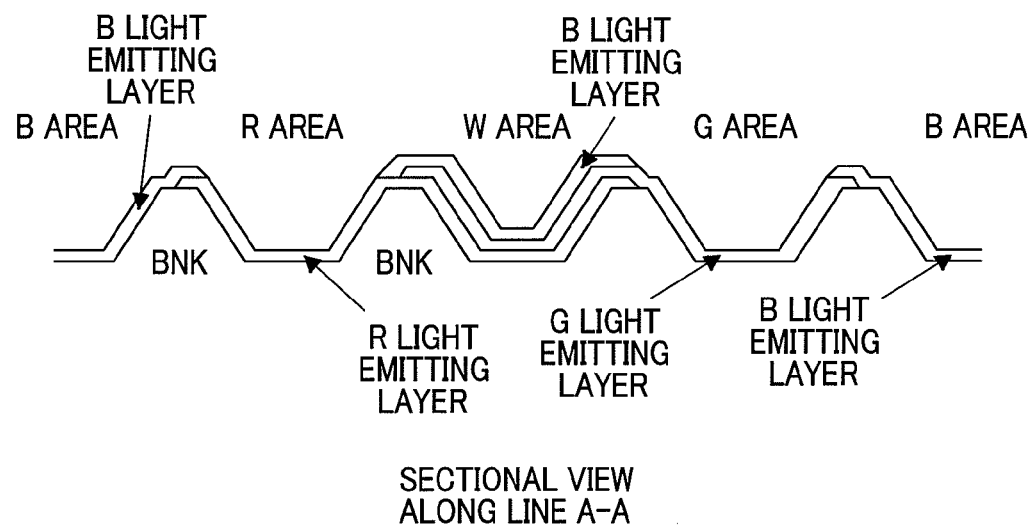

FIGS. 3A, 3B, 3C, 3D, and 3E are drawings for explaining an example of evaporation masks used for the formation of organic electroluminescence light emitting layers of the organic electroluminescence display device of the R-G-B-W method of the present invention. FIG. 3A shows a pixel array formed in the evaporation mask. FIGS. 3B, 3C, and 3D show part of mask holes (evaporation holes) of a mask for G color pixels (G mask), a mask for B color pixels (B mask), and a mask for R color pixels (R mask), respectively. FIG. 3E is a sectional view of the organic electroluminescence light emitting layers of the individual colors after evaporation by use of the above-described masks taken along the line A-A OF FIG. 3A.

The evaporation mask is formed using identical evaporation holes with colors in regions adjacent to the region of a white pixel because of simultaneous striking of them, as shown in FIGS. 3A, 3B, and 3C. As shown in FIG. 3E, an R light emitting layer, a G light emitting layer, and a B light emitting layer are stacked in the region (W region) of a white pixel. Organic electroluminescence light emitting layers of three colors are superimposed on banks BNKs surrounding the W region. Organic electroluminescence light emitting layers of two colors are superimposed on banks BNKs surrounding the regions of pixels that are not adjacent to the W region.

Figure 4A:
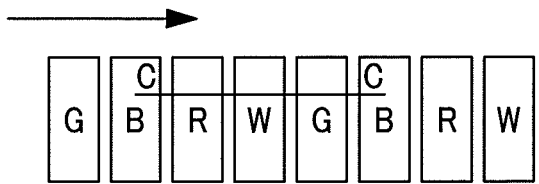
FIGS. 4A, 4B, 4C, 4D, and 4E are drawings for explaining another example of an evaporation mask used for the formation of organic electroluminescence light emitting layers of the organic electroluminescence display device of the R-G-B-W method of the present invention.
Figure 4B:
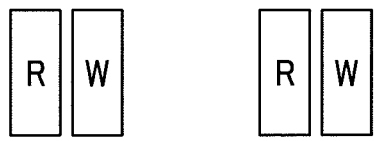
Figure 4C:
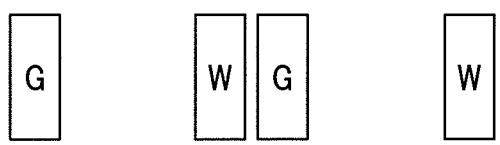
Figure 4D:
Figure 4E:
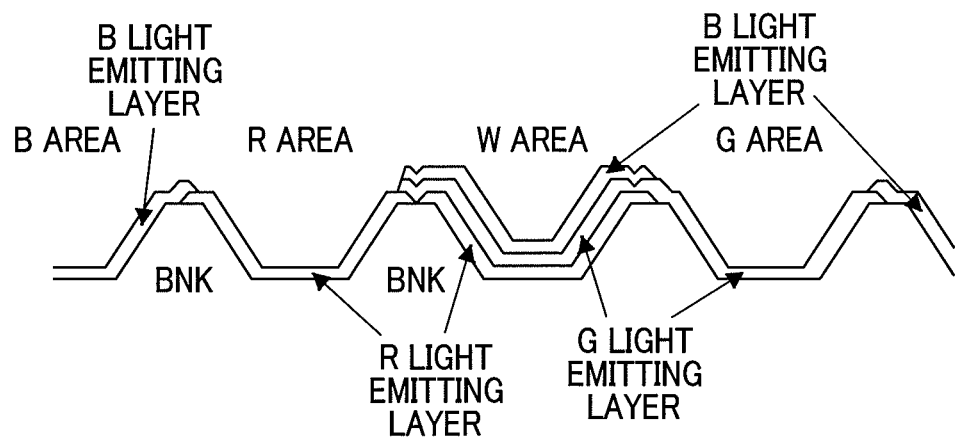

FIGS. 4A, 4B, 4C, 4D, and 4E are drawings for explaining another example of an evaporation mask used for the formation of organic electroluminescence light emitting layers of the organic electroluminescence display device of the R-G-B-W method of the present invention. FIG. 4A shows a pixel array formed in the evaporation mask. FIG. 4B shows a mask for R color pixels (R mask). FIG. 4C shows a mask for G color pixels (G mask). FIG. 4D shows a part of a mask hole (evaporation hole) of a mask for B color pixels (B mask). FIG. 4E is a sectional view of the organic electroluminescence light emitting layers of the individual colors after evaporation by use of the above-described masks taken along the line A-A of FIG. 4A.

In FIGS. 4A to 4D, organic electroluminescence light emitting layers of three colors and organic electroluminescence light emitting layers of a white color are formed using individual evaporation holes. When such masks are used, as shown in FIG. 4E, although the sectional shape of a film formed on the banks BNKs is slightly different from that of FIG. 3E, an R light emitting layer, a G light emitting layer, and a B light emitting layer are stacked in the region (W region) of a white pixel. Organic electroluminescence light emitting layers of three colors are superimposed on banks BNKs surrounding the W region. Organic electroluminescence light emitting layers of two colors are superimposed on banks BNKs surrounding the regions of pixels that are not adjacent to the W region.

Figure 5:
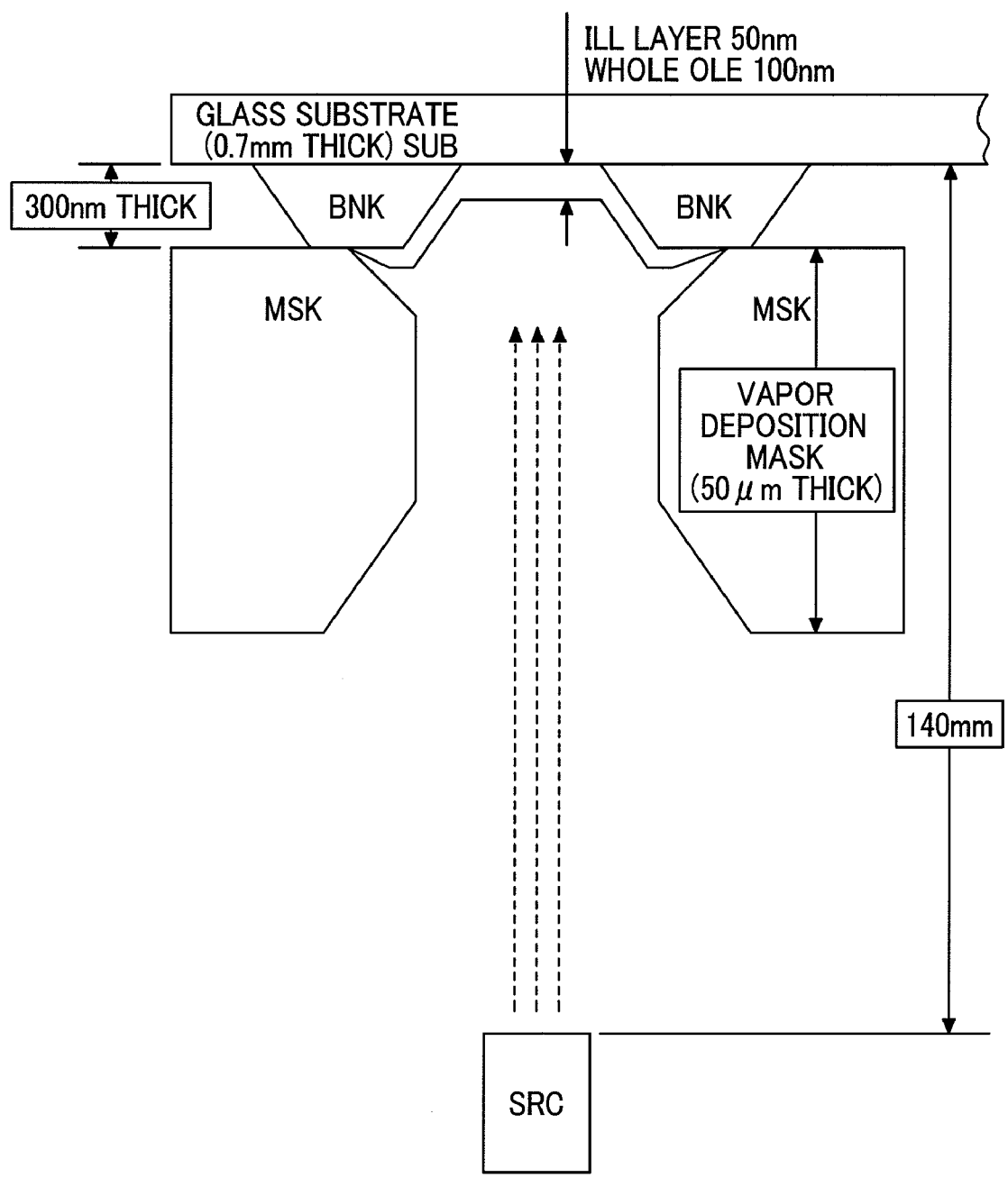
FIG. 5 is a schematic diagram for explaining more concretely the formation of an organic electroluminescence of the present invention that uses evaporation masks.
Figure 7A:
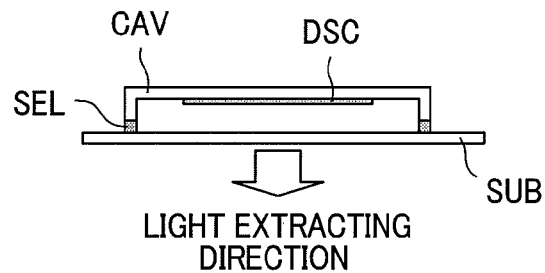
FIGS. 7A and 7B are drawings for explaining the structure of an organic electroluminescence display device of bottom emission type.
Figure 7B:
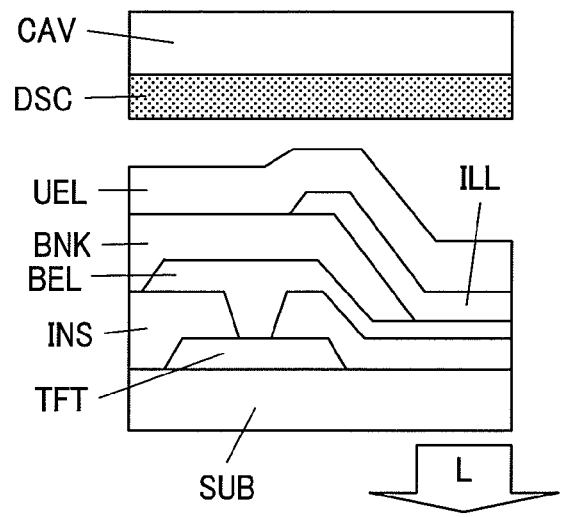
Figure 8A:
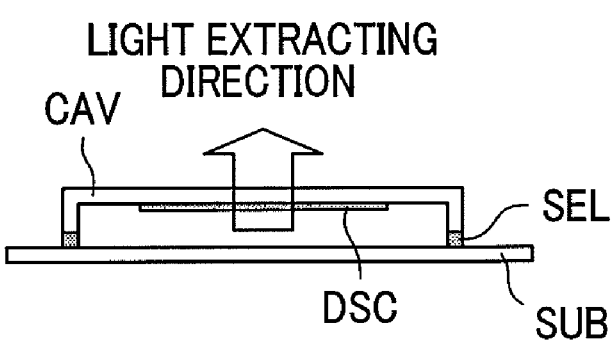
FIGS. 8A and 8B are drawings for explaining the structure of an organic electroluminescence display device of top emission type.
Figure 8B:
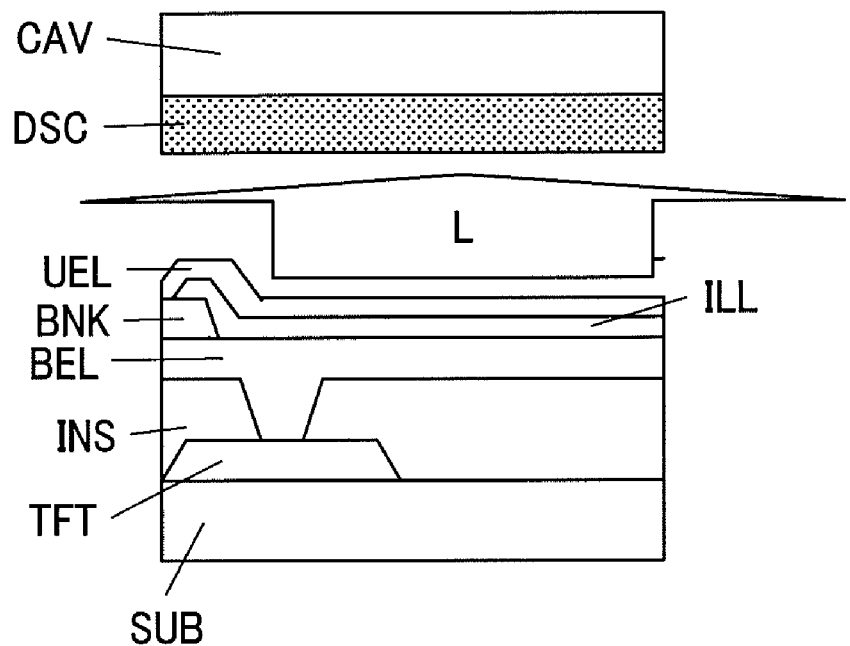

FIG. 5 is a schematic diagram for explaining more concretely the formation of an organic electroluminescence of the present invention that uses evaporation masks. The thickness of a glass substrate SUM is 0.7 mm and the height of banks BNKs is 300 mm. Evaporation masks MSK, which are 50 μm in thickness and correspond to the masks described in FIG. 4, are mounted in close contact with the banks BNK. An evaporation source (organic electroluminescence light emitting material) is mounted 140 mm apart from the glass substrate SUB for evaporation. By this construction, organic electroluminescence light emitting layers are 50 nm, and the thickness of all layers including other organic electroluminescence layers described in FIGS. 7 and 8 is 100 nm. Accordingly, the thickness of all organic electroluminescence light emitting layers of white color is 300 nm. This is simply one example.

Figure 6:
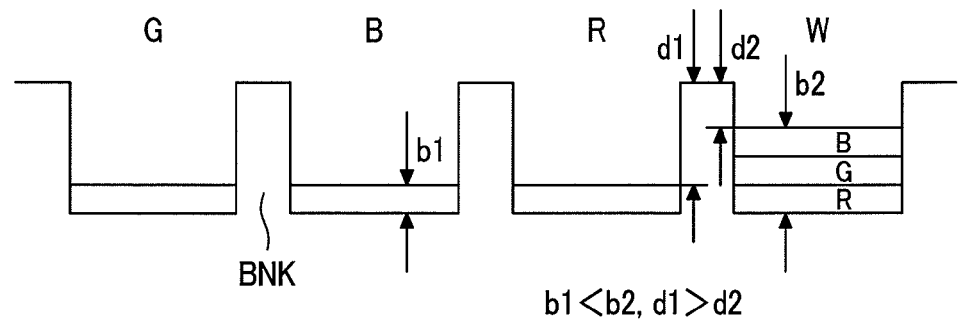
FIG. 6 is a drawing for explaining a relationship between the layer thickness of color pixels and white pixel that are shown in FIG. 3E or 4E, and the height of banks.

FIG. 6 is a drawing for explaining a relationship between the layer thickness of the color pixels and the white pixel that are shown in FIG. 3E or 4E, and the height of the banks. In FIG. 6, when the thickness of the respective organic electroluminescence layers of R pixel, G pixel, and B pixel is b1, and the thickness of an organic electroluminescence layer of W pixel is b2, a relation of b1<b2 is satisfied. When the difference between the height of the top of the respective organic electroluminescence layers of R pixel, G pixel, and B pixel, and the height of the top of banks BNKs is d1, and the difference between the height of the top of the organic electroluminescence layer of W pixel and the height of the top of the banks BNKs is d2, a relation of d1>d2 is satisfied.

What is claimed is:

1. An organic electroluminescence display device comprising: a plurality of first electrodes each formed for each of unit pixels on a principal surface of an insulating substrate; a plurality of organic electroluminescence layers that are each stacked on each of the first electrodes and emit color light different from each other; and a second electrode formed over the plurality of organic electroluminescence layers, wherein the plurality of organic electroluminescence layers, for each of the unit pixels, are at least partially surrounded by banks that partition the region of a pixel concerned, and the plurality of organic electroluminescence layers form a full color pixel by the unit pixels respectively having color organic electroluminescence layers that emit a different one of three primary colors of light as color unit pixels, and a unit pixel that emits white light, and an organic electroluminescence layer of the unit pixel that emits white light is a three-layered film of the color organic electroluminescence layers, wherein each layer of the three-layered film emits a different one of the three primary colors.

2. The organic electroluminescence display device of claim 1, wherein a thickness of the organic electroluminescence layer of the three-layered film of the unit pixel that emits white light is larger than a thickness of respective ones of the color organic electroluminescence layers of the color unit pixels.

3. The organic electroluminescence display device of claim 1, wherein a distance between a top of the banks and a top of the organic electroluminescence layer of the unit pixel that emits white light and is adjacent to at least one of the banks is smaller than a distance between the top of the banks and the top of the color organic electroluminescence layers of the color unit pixels adjacent to at least one of the banks.

4. An organic electroluminescence display device comprising: a plurality of first electrodes each formed for each of unit pixels on a principal surface of an insulating substrate; a plurality of organic electroluminescence layers that are each stacked on each of the first electrodes and emit color light different from each other; and a second electrode formed over the plurality of organic electroluminescence layers, wherein the plurality of organic electroluminescence layers, for each of unit pixels, are at least partially surrounded by banks that partition the region of a pixel concerned, and the plurality of organic electroluminescence layers form a full color pixel by unit pixels respectively having color organic electroluminescence layers that emit a different one of three primary colors of light as color unit pixels, and a unit pixel that emits white light, wherein an organic electroluminescence layer of the unit pixel that emits white light is a three-layered film of the color organic electroluminescence layers, wherein each layer of the three-layered film emits a different one of the three primary colors, and wherein at least one layer of the three-layered film is made to continue to the color organic electroluminescence layers of pixels adjacent to the unit pixel that emits white light, over the banks.

5. The organic electroluminescence display device of claim 4, wherein a plurality of pixels of different colors that emit the three primary colors are disposed in a scanning direction, and pixels adjacent to the unit pixel that emits white light are the color pixels that are adjacent to one side or both sides in the scanning direction with respect to the unit pixel that emits white light.

6. The organic electroluminescence display device of claim 1, wherein the color organic electroluminescence layers that emit the three primary colors are stacked on the banks that surround pixels adjacent to the unit pixel that emits white light.

7. The organic electroluminescence display device of claim 1, wherein organic electroluminescence layers of two colors of the color organic electroluminescence layers that emit three primary colors are stacked on the banks that at least partially surround pixels not adjacent to the unit pixel that emits white light.

* * * * *